US011698758B2

(12) United States Patent
Ho (10) Patent No.: US 11,698,758 B2
(45) Date of Patent: Jul. 11, 2023

(54) SELECTIVE COMPRESSION CIRCUITRY IN A MEMORY DEVICE

(71) Applicant: Micron Technology, Inc., Boise, ID (US)

(72) Inventor: Loon Ming Ho, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 528 days.

(21) Appl. No.: 16/222,744

(22) Filed: Dec. 17, 2018

(65) Prior Publication Data

US 2020/0192607 A1 Jun. 18, 2020

(51) Int. Cl.
*G06F 3/06* (2006.01)
(52) U.S. Cl.
CPC .......... *G06F 3/0661* (2013.01); *G06F 3/0608* (2013.01); *G06F 3/0673* (2013.01)
(58) Field of Classification Search
None
See application file for complete search history.

(56) References Cited

U.S. PATENT DOCUMENTS

| 6,735,729 | B1 | 5/2004 | Merritt et al. |
| 6,876,217 | B2 * | 4/2005 | Dankowski ............ G11C 29/40 |
| | | | 324/762.01 |
| 7,706,199 | B2 * | 4/2010 | Ku ........................ G11C 29/40 |
| | | | 365/201 |
| 9,824,776 | B1 * | 11/2017 | Kim ...................... G11C 29/40 |
| 2003/0071649 | A1 | 4/2003 | Dankowski et al. |
| 2008/0212383 | A1 | 9/2008 | Ku et al. |
| 2014/0063888 | A1 | 3/2014 | Lee et al. |
| 2014/0301149 | A1 | 10/2014 | Hsu |
| 2015/0221370 | A1 | 8/2015 | Kim et al. |

FOREIGN PATENT DOCUMENTS

JP 2010-539633 A 12/2010

OTHER PUBLICATIONS

International Search Report and Written Opinion issued in PCT/US2019/044902, dated Nov. 18, 2019 (12 pages).

* cited by examiner

*Primary Examiner* — Michael Krofcheck
(74) *Attorney, Agent, or Firm* — Fletcher Yoder, P.C.

(57) ABSTRACT

Methods and systems for selectively compressing data lines of a memory device in selective compression circuitry. The selective compression circuitry receives multiple data lines and compression circuitry that selectively compresses inputs. The selective compression circuitry also includes control circuitry to receive data over via the data lines. The control circuitry, when in a compressed mode, transmits data from each of the data lines to the compression circuitry. Alternatively, in an uncompressed mode, the control circuitry transmits data from a first subset of the data lines to the compression circuitry while blocking data from a second subset of the data lines from being transmitted to the compression circuitry.

21 Claims, 6 Drawing Sheets

| COMP_SEL | MAT_SEL | IO_SEL0 | IO_SEL1 | DATAOE <0> | DATA1E <0> | MATCHE <0> | DATAOE <1> | DATA1E <1> | MATCHE <1> | DATAOE <2> | DATA1E <2> | MATCHE <2> | DATAOE <3> | DATA1E <3> | MATCHE <3> | Fn Odd SAGAP | Fn Even SAGAP | Err Even | Err Odd | Pass |
|---|---|---|---|---|---|---|---|---|---|---|---|---|---|---|---|---|---|---|---|---|
| 1 | 0 | 0 | 0 | YM0EI0A | 1 | YM0EI0A | 1 | 1 | 1 | 1 | 1 | 1 | 1 | 1 | 1 | 0 | 1 | YM0EI0A | 0 | YM0EI0A |
| 1 | 0 | 0 | 1 | 1 | 1 | 1 | YM0EI0B | 1 | YM0EI0B | 1 | 1 | 1 | 1 | 1 | 1 | 0 | 1 | YM0EI0B | 0 | YM0EI0B |
| 1 | 0 | 1 | 0 | 1 | 1 | 1 | 1 | 1 | 1 | YM0EI0C | 1 | YM0EI0C | 1 | 1 | 1 | 0 | 1 | YM0EI0C | 0 | YM0EI0C |
| 1 | 0 | 1 | 1 | 1 | 1 | 1 | 1 | 1 | 1 | 1 | 1 | 1 | YM0EI0D | 1 | YM0EI0D | 0 | 1 | YM0EI0D | 0 | YM0EI0D |
| 1 | 1 | 0 | 0 | 1 | YM2EI0A | YM2EI0A | 1 | 1 | 1 | 1 | 1 | 1 | 1 | 1 | 1 | 0 | 1 | YM2EI0A | 0 | YM2EI0A |
| 1 | 1 | 0 | 1 | 1 | 1 | 1 | 1 | YM2EI0B | YM2EI0B | 1 | 1 | 1 | 1 | 1 | 1 | 0 | 1 | YM2EI0B | 0 | YM2EI0B |
| 1 | 1 | 1 | 0 | 1 | 1 | 1 | 1 | 1 | 1 | 1 | YM2EI0C | YM2EI0C | 1 | 1 | 1 | 0 | 1 | YM2EI0C | 0 | YM2EI0C |
| 1 | 1 | 1 | 1 | 1 | 1 | 1 | 1 | 1 | 1 | 1 | 1 | 1 | 1 | YM2EI0D | YM2EI0D | 0 | 1 | YM2EI0D | 0 | YM2EI0D |

Even Gap

FIG. 7

| | COMP_SEL | MAT_SEL | IO_SEL0 | IO_SEL1 | DATA00 <0> | DATA10 <0> | MATCH0 <0> | DATA00 <1> | DATA10 <1> | MATCH0 <1> | DATA00 <2> | DATA10 <2> | MATCH0 <2> | DATA00 <3> | DATA10 <3> | MATCH0 <3> | Fn Odd SAGAP | Fn Even SAGAP | Err Even | Err Odd | Pass |
|---|---|---|---|---|---|---|---|---|---|---|---|---|---|---|---|---|---|---|---|---|---|
| Odd Gap | 1 | 0 | 0 | 0 | YM001A | 1 | YM001A | 1 | 1 | 1 | 1 | 1 | 1 | 1 | 1 | 1 | 1 | 0 | 0 | YM001A | YM001A |
| | 1 | 0 | 0 | 1 | 1 | 1 | 1 | YM001B | 1 | YM001B | 1 | 1 | 1 | 1 | 1 | 1 | 1 | 0 | 0 | YM001B | YM001B |
| | 1 | 0 | 1 | 0 | 1 | 1 | 1 | 1 | 1 | 1 | YM001C | 1 | YM001C | 1 | 1 | 1 | 1 | 0 | 0 | YM001C | YM001C |
| | 1 | 0 | 1 | 1 | 1 | 1 | 1 | 1 | 1 | 1 | 1 | 1 | 1 | YM001D | 1 | YM001D | 1 | 0 | 0 | YM001D | YM001D |
| | 1 | 1 | 0 | 0 | 1 | YM201A | YM201A | 1 | 1 | 1 | 1 | 1 | 1 | 1 | 1 | 1 | 1 | 0 | 0 | YM201A | YM201A |
| | 1 | 1 | 0 | 1 | 1 | 1 | 1 | 1 | YM201B | YM201B | 1 | 1 | 1 | 1 | 1 | 1 | 1 | 0 | 0 | YM201B | YM201B |
| | 1 | 1 | 1 | 0 | 1 | 1 | 1 | 1 | 1 | 1 | 1 | YM201C | YM201C | 1 | 1 | 1 | 1 | 0 | 0 | YM201C | YM201C |
| | 1 | 1 | 1 | 1 | 1 | 1 | 1 | 1 | 1 | 1 | 1 | 1 | 1 | 1 | YM201D | YM201D | 1 | 0 | 0 | YM201D | YM201D |

SELECTIVE COMPRESSION CIRCUITRY IN A MEMORY DEVICE

BACKGROUND

Field of the Present Disclosure

Embodiments of the present disclosure relate generally to testing memory cores or cells in a memory device. More specifically, embodiments of the present disclosure relate to selectively compressing data lines in the memory device.

Description of Related Art

Memory devices, such as synchronous dynamic random access memory (SDRAM) devices, may include denser and denser memory cells. During the manufacturing process, the memory device may be tested to verify proper operation of the memory device. If improperly functioning cells of the memory device are identified, the memory device may be repaired or discarded, depending on the number, type, and arrangement of faulty memory cells. Also, if a sample of memory devices is tested and the individual memory devices are found to have faults in common locations, certain stages in the manufacturing process may be examined and/or altered to correct possible systemic defects.

As the density of memory devices increases, the time used to test the devices also increases. Compression circuits may be used to simultaneously test blocks of memory cells and provide information regarding the success or failure of the test. In other words, a test using a compression circuit indicates that one of the cells in the block of cells in the simultaneous test is faulty. Further testing (e.g., using different probe pads) may be deployed to identify the specific cell since the compression circuit does not provide granularity sufficient to identify specific failing bits.

Embodiments of the present disclosure may be directed to one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As previously noted, memory devices, such as synchronous dynamic random access memory (SDRAM) devices, may include denser memory cells. During the manufacturing process, the memory device may be tested using probes to verify proper operation of the memory device. If improperly functioning cells of the memory device are identified, the memory device may be repaired or discarded, depending on the number, type, and arrangement of faulty memory cells. Also, if a sample of memory devices is tested and the individual memory devices are found to have faults in common locations, certain stages in the manufacturing process may be examined and/or altered to correct possible systemic defects.

As the density of memory devices increases, the time used to test the devices also increases. Compression circuits may be used to simultaneously test blocks of memory cells and provide information regarding the success or failure of the test. In other words, a test using a compression circuit indicates that one of the cells in the block of cells in the simultaneous test is faulty. However, to acquire specific data line testing other probe pads may be used. Instead, of performing different additional testing using additional probes, control circuitry may be used to control which data lines are passed to the compression circuit, in accordance with the embodiments described herein. For instance, using control signals, all but one data line may be suppressed from the compression circuits in an uncompressed mode to cause data from the data line to pass through the compression circuits to selectively measure any of the data lines connected to the control circuit via the compression circuits without changing probe pads.

Figure 1:
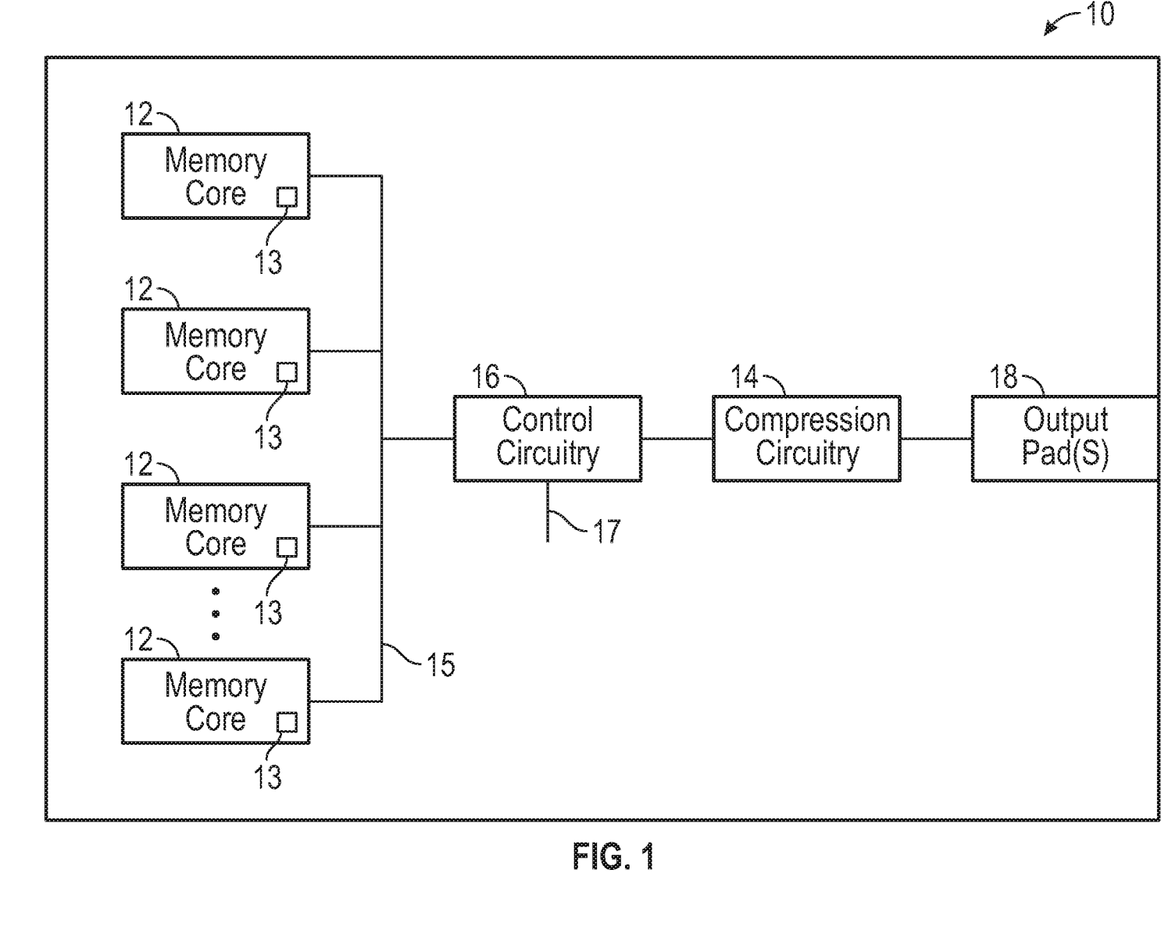
FIG. 1 is a simplified block diagram of an electronic device having compression circuitry, in accordance with an embodiment.

FIG. 1 is a block diagram of an electronic device 10. The electronic device 10 may include one or more memory core(s) 12 each containing one or more memory cells 13. The electronic device 10 may include compression circuitry 14. The memory device core(s) 12 each have input/output lines (I/O lines) 15 that are connected to the compression circuitry 14. For instance, in some embodiments, each memory device core 12 may have corresponding compression circuitry 14 within the compression circuitry 14. Indeed, in some embodiments, the compression circuitry 14 for each memory core 12 may be included in the memory core rather than separate from the respective memory core 12 in the compression circuitry 14.

Furthermore, the memory cells 13 within the memory core 12 may be arranged in one or more planes with the memory cells 13 organized in a cross-point architecture. In such architectures, the memory cells 13 may be arranged in a matrix of rows and columns. The memory cells 13 are located at the intersections of conductive lines. Furthermore, in some embodiments, each memory core 12 may include multiple vertically stacked planes of memory cells 13. That is, the planes can be formed at different elevations from one another. The memory core 12 may then decode (e.g., via one or more decoders) memory cell addresses and locations.

The compression circuitry 14 receives and compresses multiple I/O lines 15 and provides an output based on controls signals 17 transmitted to the selective control circuitry 16 (e.g., from a host device or processor coupled to the electronic device 10). The compression circuitry 14 then outputs compressed or selected outputs to output pad(s) 18 indicating the data present on the I/O lines 15 that was read from one or more of the memory cores 12 and/or whether the data matches the pattern that was written into that memory device core 12. In some embodiments, the data input/output (DQ) lines may be used to transmit data from the memory core(s) 12 to the compression circuitry 14. Furthermore, in some embodiments, the compression circuitry 14 may be separate from the memory cores 12 and use the DQ lines to compresses data on the DQ lines leaving the memory cores 12, as opposed to compressing the data on the I/O lines 15 within the memory cores 12. Such a configuration allows the compression circuitry 14 to be shared by the memory cores 12, thus permitting each of the memory cores 12 to be tested without duplicating compression logic. Also, when the compression circuitry 14 is separate from the memory cores 12, changes in the design or density of the memory cores 12 may be made without re-designing or modifying the compression circuitry 14.

The electronic device 10 may include a memory device (e.g., SDRAM) with the compression circuit(s) that may be included on a die of the memory device along with the memory cores 12. In embedded devices with multiple memory cores, each core may have its own compression circuitry or may share multiple compression circuits between memory cores 12. The compression circuitry receives inputs from the I/O lines 15 and provides an output via the output pad 18 indicating that either all lines passed or that at least one of the lines failed. One or more compression circuits 14 may be used, depending on the degree of desired compression. For example, if it is desired to simultaneously test 64 lines, each compression circuitry may be adapted to receive eight input lines using eight compression circuits 16. The outputs of the compression circuitry 14 may be tied to a DQ line of the memory device.

During a testing process, the compression circuitry 14 adds a finite amount of delay to the stage of the memory device including the compression circuitry 14. The memory device may have lines with differing data topologies. For example, if a logic "1" is written into a cell of a first topology type, a logic "1" is stored in the cell. If the same logic "1" is written into a cell of a second topology, a logic "0" may actually be stored in the cell. During the testing of the electronic device 10, lines of one topology type may not be compressed with lines of a second topology type.

Furthermore, each memory core 12 may have a set number (e.g., 64) of I/O lines 15 and a number (e.g., 4) of output pads 18. Accordingly, the compression circuitry 14 is adapted to perform a compression ratio (e.g., 16-to-1 compression ratio) to populate the output pads 18. The compression ratio may be dependent upon certain factors, such as the number of I/O lines 15 exiting each memory device core 12 and the number of output pads 18 available on the electronic device 10.

Returning to FIG. 1, the compression circuitry 14 compresses an array of memory units in the memory cores 12 to enable simultaneous testing with a single output via the output pad 18. However, this output alone does not provide granularity to test individual memory cells 13 within the memory cores 12 using the compression circuitry 14 in a compression mode. Instead, selective decompression using control circuitry 16 may selectively increase granularity in testing by providing decompressed data from fewer memory cells 13 when compression is disabled via the control circuitry 16. In other words, the control circuitry 16 may selectively control whether the output via the output pad 18 is compressed from multiple memory cells 13 in the memory core(s) 12 or is uncompressed data from an individual memory cell in a memory core 12. Thus, the control circuitry 16 enables uncompressed address visibility while continuing to use current probe resources in the compression circuitry 14 to enable selective compression during compressed probe testing. In other words, the control circuitry 16 receives a number (e.g., 4) of control signals 17 that may be used to detect which bit corresponds to data. For instance, the signals may specify a row and column and/or plane of memory cells 13 in the memory core(s) 12.

In some embodiments, the electronic device 10 may include additional components, such as a processor and memory buffers. The memory buffers may be used to store data read from the memory cores 12 and/or store a pattern to compare the data from the memory cores 12 against. The processor may be used to send the control signals 17 to control whether the compression circuitry 14 and control circuitry 16 operate in a compressed mode or uncompressed mode.

Although the compression circuitry 14 is described in the context of single electronic device 10 including multiple memory cores 12, other embodiments of the compression circuitry 14 may be applied. For instance, stand-alone commodity memory devices may include compression circuitry 14 in each memory device with a single memory core 12.

Figure 2:
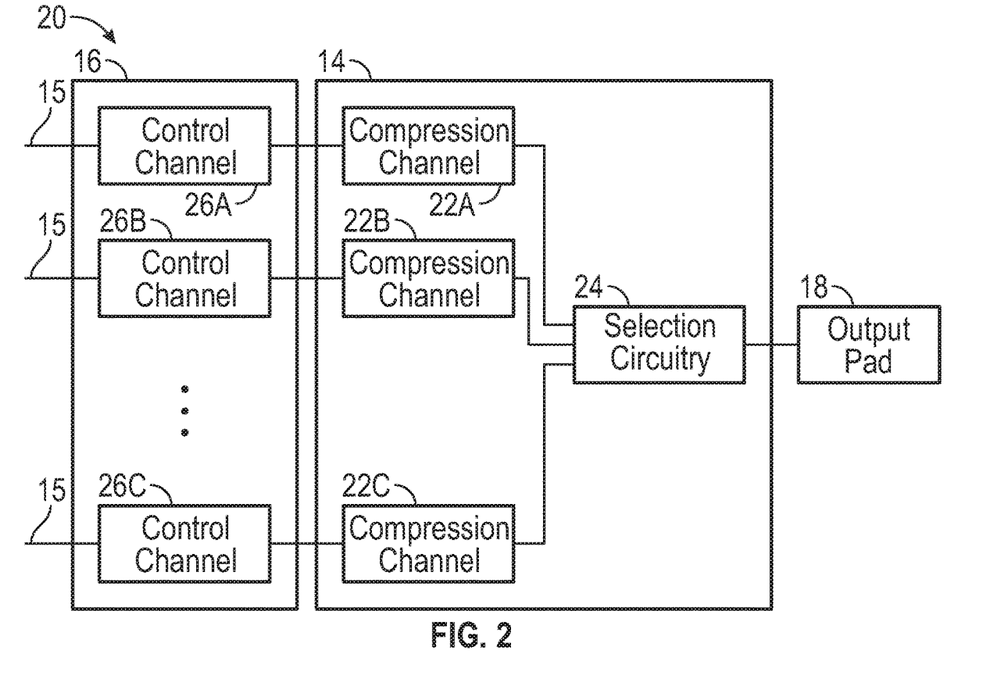
FIG. 2 is a block diagram of an embodiment of the compression circuitry of FIG. 1 having control channels, compression channels, and selection circuitry, in accordance with an embodiment.

FIG. 2 is a block diagram of an embodiment of the compression circuitry 14 and the control circuitry 16. As illustrated, the compression circuitry 14 includes multiple parallel compression channels 22 (e.g., 22A, 22B, and 22C) that selectively compresses data (e.g., error conditions) for the compression channels 22 and passes an output to the output pad 18 via selection circuitry 24. As discussed below, the selection circuitry 24 ensures that the proper data (e.g., errors or actual data) is transmitted to the output pad 18. Also, each compression channel 22 has a corresponding control channel 26 (e.g., 26A, 26B, and 26C) to control what data is passed through the compression channel 22.

Figure 3:
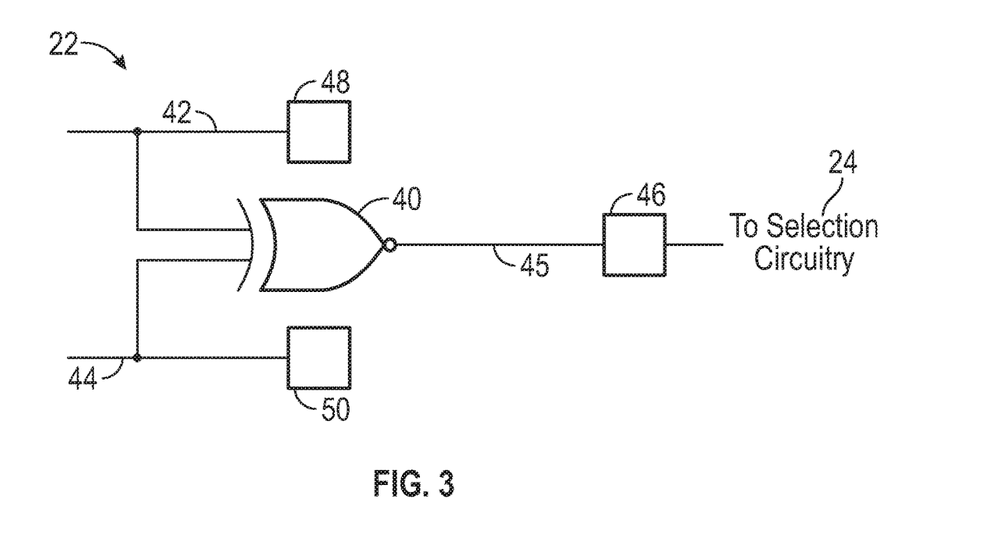
FIG. 3 is a schematic diagram of the compression channels of FIG. 2, in accordance with an embodiment.

FIG. 3 is a schematic diagram of an embodiment of the compression channel 22. As illustrated, the compression channel 22 includes an exclusive OR (XOR) gate 40 that receives data inputs 42 and 44. As discussed below, the data inputs 42 and 44 are received by the compression channel 22 from a corresponding control channel 26. As discussed below, the control channel 26 controls whether data from the memory core(s) 12 is passed to the compression channel 22 in both data inputs 42 and 44 for compression in the compression circuitry 14 or whether at least one of the data inputs 42 or 44 is suppressed to cause the compression circuitry 14 to output specific data from specific memory cells 13. The XOR gate 40 sends an output 45 to the selection circuitry 24 to combine outputs from other compression channels 22. In some embodiments, the data inputs 42 and 44 may both be suppressed causing the output 45 to have no effect on the output of the selection circuitry 24 enabling passing through of a specific data input from another compression channel 22. In other words, in an uncompressed mode and when memory cells 13 corresponding to other channels are selected, the output 45 of the compression channel 22 may be suppressed by suppressing the data inputs 42 and 44 to the compression channel 22.

When in the uncompressed mode and one of the data inputs 42 or 44 is selected, the other data input may be suppressed by the control channel 26. When the compressed mode is selected, the data inputs 42 and 44 are both passed through the control channel 26 to the compression channel 22 to enable the compression channel to compare the data inputs 42 and 44 for a match that is output via the output 45 using the XOR gate 40. In some embodiments, the compression channel 22 may include pads 46, 48, and/or 50 to respectively test the output 45 and/or the data inputs 42 or 44.

Figure 4:
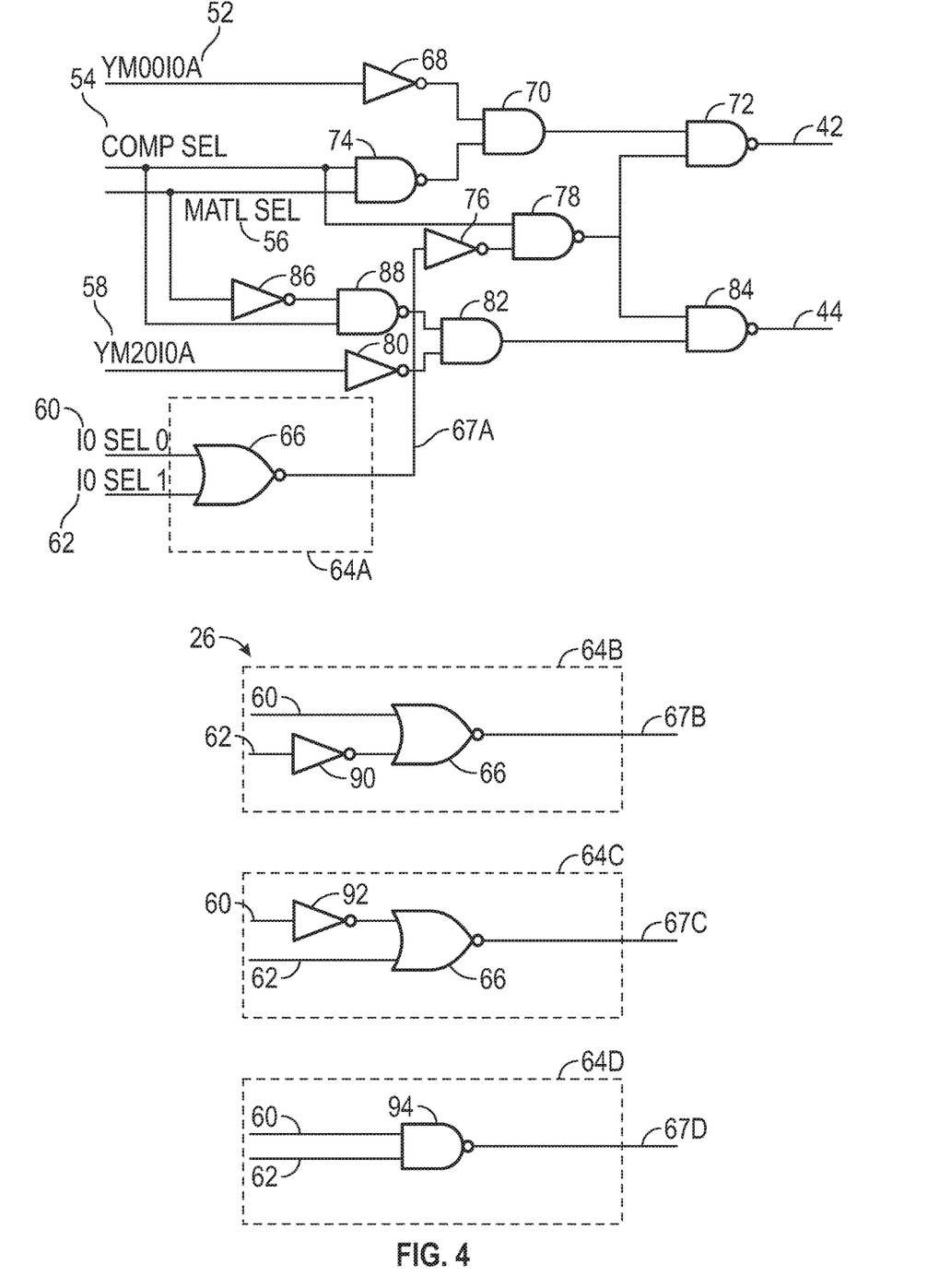
FIG. 4 is a schematic diagram of the control channel of FIG. 2, in accordance with an embodiment.

FIG. 4 is a schematic diagram of an embodiment of the control channel 26. The control channel 26 illustrated may be a channel configured to control compression of memory cells 13 that are on an odd gap of a sensing amplifier of the memory device. The control channel 26 may receive a YM0OIOA signal 52, a COMP_SEL signal 54, a MAT_SEL signal 56, a YM2OIOA signal 58, an I/O_SEL0 signal 60, and an I/O_SEL1 signal 62. The YM0OIOA signal 52 and the YM2OIOA signal 58 may be used to write and read data. The COMP_SEL signal 54 may be used as a compression selection signal to designate whether the control circuitry 16 decompresses the data passed through the control circuitry 16 to use the COMP_SEL signal 54 to effectively bypass the control circuitry 16. The MAT_SEL signal 56 may be used as a data line selection signal to perform one level of selection to select a set of data lines with a single data line in each channel while the I/O_SEL0 signal 60 and the I/O_SEL1 signal 62 select a specific channel to select the single data line of the selected channel. In some embodiments, a third level of selection may be made by using a signal to select an even gap or an odd gap of a sensing amplifier. For instance, the MAT_SEL signal 56 may be used to select a block of rows and/or columns of memory units in the memory core(s) 12. For instance, the MAT_SEL signal 56 may be used to select the data line corresponding to the YM0OIOA signal 52 using a first value (e.g., 0) and the data line corresponding to the YM2OIOA signal 58 using a second value (e.g., 1).

The I/O_SEL0 signal 60 and the I/O SELL signal 62 may be used together as a selection signal to select a row and/or column in the block of rows and/or columns indicated by the MAT_SEL signal 56. In some embodiments, the I/O_SEL0 signal 60 and the I/O SELL signal 62 may be used together as a channel selection signal that selects a control channel 26 (and its corresponding data lines). For instance, the I/O_SEL0 signal 60 and the I/O_SEL1 signal 62 may together form a binary number to select between up to four different control channels 26. In some embodiments, a different number of I/O selection signals may be used with a different number of channels as long as the number of channels is less than 2An, where n is the number of I/O selection signals.

Each control channel 26 may be selected using selection circuitry 64 configured to individually select control channels 26 among a group of control channels 26 (e.g., channels corresponding to an odd gap of a sensing amplifier) to output a selection signal 67 to a remainder of the control channel 26. For instance, with 4 control channels 26 per group of control channels 26, in the illustrated embodiment, selection circuitry 64A includes a NOR gate 66 that outputs a selection signal 67A that is $\overline{(A+B)}$, where the I/O_SEL0 signal 60 is A and I/O_SEL1 signal 62 is B for a first channel. In a next control channel 26 in the group of control channels 26, selection circuitry 64B includes an inverter 90 for the I/O_SEL1 signal 62, such that a selection signal 67B is $\overline{(A+\overline{B})}$, where the I/O_SEL0 signal 60 is A and I/O_SEL1 signal 62 is B. In yet another control channel 26 of the group of control channels 26, selection circuitry 64C includes an inverter 92 for the I/O_SEL0 signal 60, such that a selection signal 67C is $\overline{(\overline{A}+B)}$, where the I/O_SEL0 signal 60 is A and I/O SELL signal 62 is B. In yet another control channel 26 of the group of control channels 26, selection circuitry 64 includes a NAND gate 94 instead of the NOR gate 66, such that a selection signal 67D is $\overline{(A \cdot B)}$, where the I/O_SEL0 signal 60 is A and I/O_SEL1 signal 62 is B. In other words, only one of the control channels 26 in a group of control channels 26 has an asserted selection signal 67 at one time in response to the same I/O_SEL0 signal 60 and I/O_SEL1 signal 62, such that the I/O_SEL0 signal 60 and the I/O_SEL1 signal 62 may be used to indicate individual data lines in a block of lines indicated by the MAT_SEL 56 that indicates a portion of memory within an even gap or an odd gap.

Since multiple control channels 26 and/or groups of control channels 26 may be used in the control circuitry 16, a similar control channel 26 may be used for other control channels 26. For instance, for other channels in the same odd gap side of the sensing amplifier may use similar signals except that the data lines may be named with different letters and/or the selection circuitry 64 may be different, as previously described. For instance, YM0OIOB may be used for a second channel and YM0OIOC may be used for a third channel and so on. Additionally, similar control channels 26 may be employed for an odd gap of the sensing amplifier of the memory device using at least some different control signals. For instance, similar signals may be used with the YM0OIOA signal 52 and the YM2OIOA signal 58 replaced with the YM0EIOA signal and the YM2EIOA signal. Similar data lines of other control channels 26 may be denoted with other designators, such as YM0EIOB, YM0EIOA, and the like.

Returning to FIG. 4, the YM0OIOA signal 52 is transmitted to an inverter 68 that inverts the YM0OIOA signal 52 before transmitting the inverted YM0OIOA signal 52 to an AND gate 70. An output of the AND gate 70 is used to control whether the YM0OIOA signal 52 is transmitted to the data input 42. The AND gate 70 also receives an output of a NAND gate 74 that receives the COMP_SEL signal 54 and the MAT_SEL signal 56. When the COMP_SEL signal 54 indicates that decompression is being used, and the control channel 26 is selected via the MAT_SEL signal 56, the AND gate 70 may pass the YM0OIOA signal 52.

The NAND gate 72 may gate the YM0OIOA signal 52 using the COMP_SEL signal 54 and the MAT_SEL signal 56, such that the output of the NAND gate 72 drives the data input 42 to YM0OIOA signal 52 only when the COMP_SEL signal 54 indicates that compression is performed, the MAT_SEL signal 56 selects YM0 blocks, and the selection signal 67 indicates that the corresponding control channel 26 is selected. The selection signal 67 selects the control channel 26 and causes the NAND gate 72 to pass the YM0OIOA signal 52 via an inverter 76 and a NAND gate 78 when the COMP_SEL signal 54 indicates that compression is performed, the MAT_SEL signal selects YM0 blocks.

Similarly, the YM2OIOA signal 58 may be gated using an inverter 80, an AND gate 82, and a NAND gate 84. The AND gate 82 functions similar to the AND gate 70 except only when the MAT_SEL signal 56 selects a different block YM2 instead of YM0. Since a selection of YM2 is inverse of a selection YM0 in the MAT_SEL signal 56, the AND gate 82 utilizes an inverter 86. The NAND gate 84 also functions similarly to the NAND gate 72. For instance, the NAND gate 84 may gate the YM2OIOA signal 58 using the COMP_SEL signal 54 and the MAT_SEL signal 56, such that the output of the NAND gate 84 drives the data input 44 to YM2OIOA signal 58 only when the COMP_SEL signal 54 indicates that compression is performed, the MAT_SEL signal 56 selects YM2 blocks, and the selection signal 67 indicates that the corresponding control channel 26 is selected.

Figure 5:
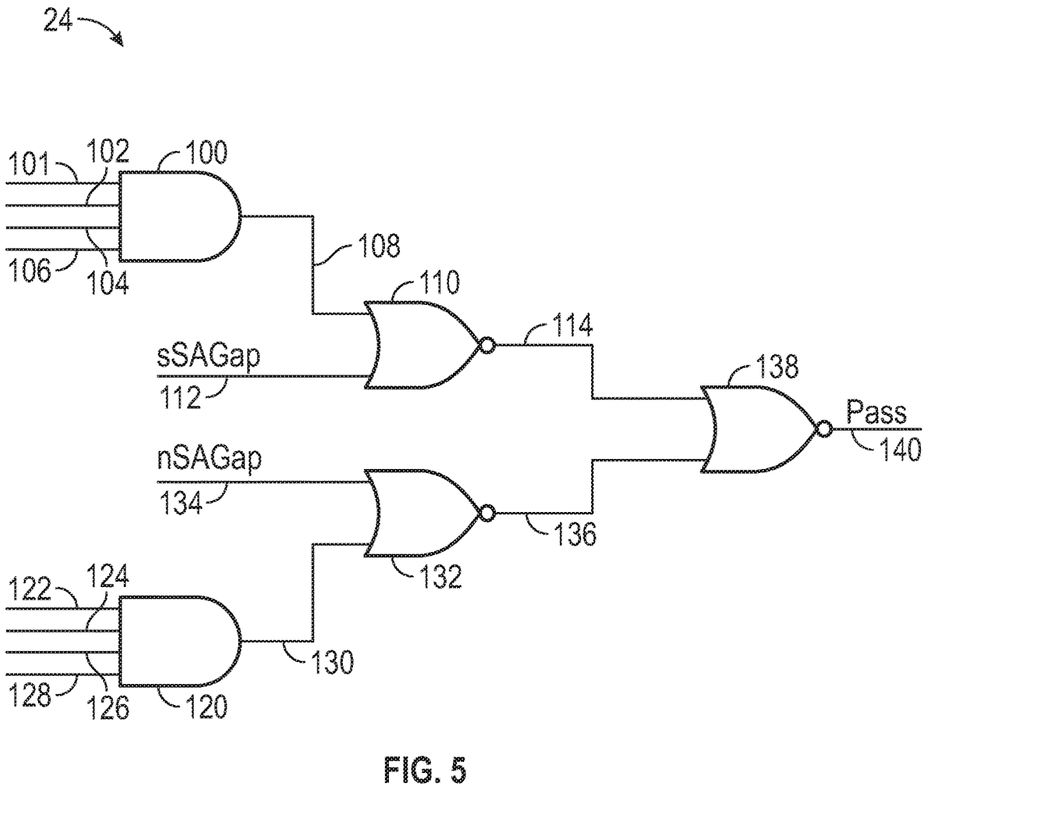
FIG. 5 is a schematic diagram of the selection circuitry of FIG. 2, in accordance with an embodiment.

FIG. 5 is a schematic diagram of an embodiment of the selection circuitry 24 that receives respective outputs 45 from multiple compression channels 22, where each compression channel 22 receives respective data inputs 42 and 44 from respective control channels 26. For instance, the selection circuitry 24 may include an AND gate 100 that receives inputs 101, 102, 104, and 106 that are output (e.g., output 45) from respective compression channels 22. The AND gate 100 provides an output 108 that is a NAND function of the inputs 101, 102, 104, and 106. In an uncompressed mode, the output 108 is indicative of data on one input (e.g., input 101), since only a single control channel 16 in the corresponding group of control channels 26 may be selected using the I/O_SEL0 signal 60 and the I/O_SEL1 signal 62 and transmit data to the corresponding compression channel transmitting the input to the selection circuitry 24. In a compressed mode, the output 108 may be indicative of whether any errors are indicated in the inputs 101, 102, 104, and/or 106. Thus, the output 108 carries passed through data from an input in the uncompressed mode or carries an indicator whether any error exists in any of the inputs 101, 102, 104, and/or 106. Regardless of whether the control channels 26 are in compressed or uncompressed modes, the output 108 is passed to a NOR gate 110 that gates the output 108 unless a gap (e.g., odd gap) of a sensing amplifier corresponding to the inputs 101, 102, 104, and 106 is selected using an SAGap signal 112. An output 114 of the NOR gate 110 is a gated output of the output 108 according to whether the corresponding sensing amplifier gap is selected.

The selection circuitry 24 also may include an AND gate 120 that receives inputs 122, 124, 126, and 128 that are output (e.g., output 45) from respective compression channels 22 of a different gap of the sensing amplifier than the inputs 101, 102, 104, and 106. The AND gate 120 outputs an output 130 that is a NAND function of the inputs 122, 124, 126, and 128. In an uncompressed mode, the output 130 is indicative of data on one input (e.g., input 122), since only a single control channel 16 in the corresponding group of control channels 26 may be selected using the I/O_SEL0 signal 60 and the I/O_SEL1 signal 62 and transmit data to the corresponding compression channel 22 transmitting the data to the selection circuitry 24. In a compressed mode, the output 130 may be indicative of whether any errors are indicated in the inputs 122, 124, 126, and/or 128. Thus, the output 130 carries passed through data from an input in the uncompressed mode or carries an indicator whether any error exists in any of the inputs 122, 124, 126, and/or 128. Regardless of whether the control channels 26 are in compressed or uncompressed modes, the output 130 is passed to a NOR gate 132 that gates the output 130 unless a gap (e.g., odd gap) of a sensing amplifier corresponding to the inputs 122, 124, 126, and 128 is selected using an nSAGap signal 134. In some embodiments, the nSAGap signal 134 may be logically inverse to the SAGap signal 112. An output 136 of the NOR gate 132 is a gated output of the output 130 according to whether the corresponding sensing amplifier gap is selected.

The outputs 114 and 136 are transmitted to a NOR gate 138 that outputs a pass signal 140. When the corresponding control channels 26 are in a compressed mode, the pass signal 140 indicates whether any errors have been captured in the inputs 101, 102, 104, 106, 122, 124, 126, and/or 128. In an uncompressed mode, the pass signal 140 indicates data that has been passed through a corresponding control channel 26 and corresponding compression channel 22.

Compression Mode Truth Tables

Figure 6:
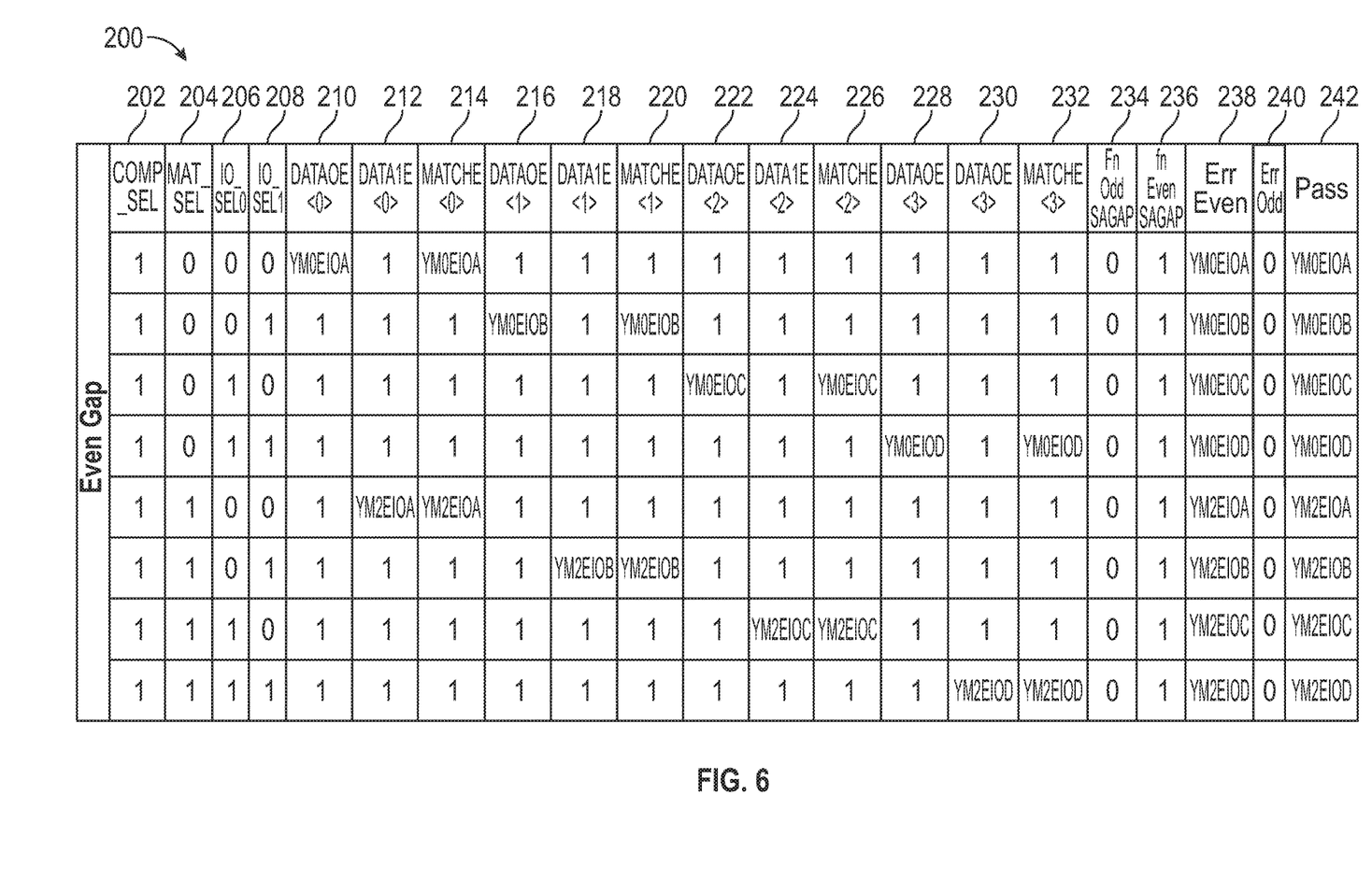
FIG. 6 is a truth table of the compression circuitry of FIG. 1 corresponding to an even gap of a sensing amplifier of the electronic device of FIG. 1 when the compression circuitry operates in an uncompressed mode, in accordance with an embodiment.

FIG. 6 is a truth table 200 reflecting logic values resulting in an embodiment of control circuitry 16 and compression circuitry 14 that includes four control channels 26 corresponding to an even gap of a sensing amplifier of the electronic device 10 in an uncompressed mode. A COMP_SEL column 202 corresponds to the COMP_SEL signal 54 received at each channel 26, the MAT_SEL column 204 corresponds the MAT_SEL signal 56 received at each control channel 26, and I/O_SEL0 and I/O_SEL1 columns 206 and 208 respectively correspond to the I/O_SEL0 signal 60 and the I/O_SEL1 signal 62. Since the truth table 200 refers to an uncompressed mode, the COMP_SEL signal 54 is set to "1" to enable the uncompressed mode.

A DATA0E<0> column 210 and DATA1E<0> column 212 correspond to data inputs 42 and 44 for a first compression channel 22 and a corresponding control channel 26 corresponding to an even gap of a sensing amplifier of the electronic device 10. A MATCHE<0> column 214 corresponds to the output 45 of the first compression channel 22.

A DATA0E<1> column 216 and DATA1E<1> column 218 correspond to data inputs 42 and 44 for a second compression channel 22 and a corresponding control channel 26 corresponding to the even gap of a sensing amplifier of the electronic device 10. A MATCHE<1> column 220 corresponds to the output 45 of the second compression channel 22.

A DATA0E<2> column 222 and DATA1E<2> column 224 correspond to data inputs 42 and 44 for a third compression channel 22 and a corresponding control channel 26 corresponding to the even gap of a sensing amplifier of the electronic device 10. A MATCHE<2> column 226 corresponds to the output 45 of the third compression channel 22.

A DATA0E<3> column 228 and DATA1E<3> column 230 correspond to data inputs 42 and 44 for a fourth compression channel 22 and a corresponding control channel 26 corresponding to the even gap of a sensing amplifier of the electronic device 10. A MATCHE<3> column 232 corresponds to the output 45 of the fourth compression channel 22.

Gap columns 234 and 236 correspond to the sSAGap signal 112 and the nSAGap signal 134. An ErrEven column 238 corresponds to the output 114 in the selection circuitry 24. An ErrOdd column 240 corresponds to the output 136 in the selection circuitry 24.

YM0EIOA and YM2EIOA are the data lines coupled to the first control channel 26 of the four control channels 26. YM0EIOB and YM2EIOB are the data lines coupled to the second control channel 26 of the four control channels 26. YM0EIOC and YM2EIOC are the data lines coupled to the third control channel 26 of the four control channels 26. YM0EIOD and YM2EIOD are the data lines coupled to the fourth control channel 26 of the four control channels 26.

As illustrated, the MAT_SEL signal 56 selects the YM0 lines when the MAT_SEL signal 56 is a first value (e.g., 0) and selects the YM2 lines when the MAT_SEL signal 56 is a second value (e.g., 1).

The I/O_SEL0 signal 60 and I/O_SEL1 signal 62 work together to use binary values to select the corresponding channels 22 and 26. For instance, a binary value of "00" selects the first compression channel 22 and corresponding control channel 26, a binary value of "01" selects the second compression channel 22 and corresponding control channel 26, a binary value of "10" selects the third compression channel 22 and corresponding control channel 26, and a binary value of "11" selects the fourth compression channel 22 and corresponding control channel 26. This decoding of binary values may be accomplished using the selection circuitry 64 in each of the channels. In other words, the MAT_SEL signal 56 selects one of two data lines in a channel, and the I/O_SEL0 signal 60 and the I/O_SEL1 signal 62 select the channel.

As illustrated, the output 114 reflects the selected data line of a selected channel. Furthermore, when the even gap is selected and the odd gap is not selected, the output 114 is transmitted to the pass signal 140 used to measure the data.

Figure 7:
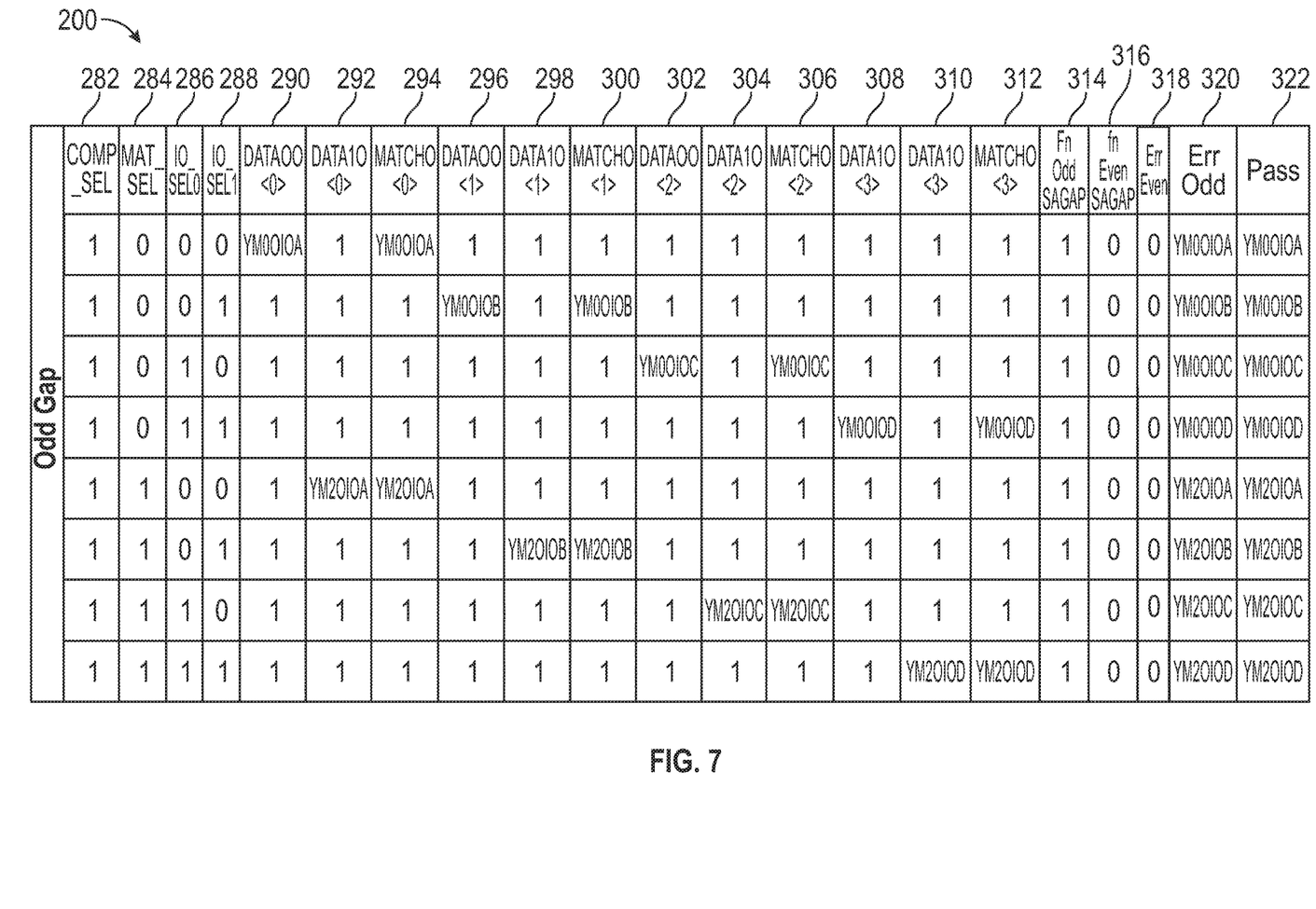
FIG. 7 is a truth table of the compression circuitry of FIG. 1 corresponding to an odd gap of a sensing amplifier of the electronic device of FIG. 1 when the compression circuitry operates in an uncompressed mode, in accordance with an embodiment.

FIG. 7 is a truth table 280 reflecting logic values resulting in an embodiment of control circuitry 16 and compression circuitry 14 that includes four control channels 26 corresponding to an odd gap of a sensing amplifier of the electronic device 10 in an uncompressed mode. A COMP_SEL column 282 corresponds to the COMP_SEL signal 54 received at each channel 26, the MAT_SEL column 284 corresponds the MAT_SEL signal 56 received at each control channel 26, and I/O_SEL0 and I/O_SEL1 columns 286 and 288 respectively correspond to the I/O_SEL0 signal 60 and the I/O_SEL1 signal 62. Since the truth table 280 refers to an uncompressed mode, the COMP_SEL signal 54 is set to "1" to enable the uncompressed mode.

A DATA0O<0> column 290 and DATA1O<0> column 292 correspond to data inputs 42 and 44 for a first compression channel 22 and a corresponding control channel 26 corresponding to an odd gap of a sensing amplifier of the electronic device 10. A MATCHO<0> column 294 corresponds to the output 45 of the first compression channel 22.

A DATA0O<1> column 296 and DATA1O<1> column 298 correspond to data inputs 42 and 44 for a second compression channel 22 and a corresponding control channel 26 corresponding to the odd gap of a sensing amplifier of the electronic device 10. A MATCHO<1> column 300 corresponds to the output 45 of the second compression channel 22.

318 corresponds to the output 114 in the selection circuitry 24. An ErrOdd column 320 corresponds to the output 136 in the selection circuitry 24.

YM0OIOA and YM2OIOA are the data lines coupled to the first control channel 26 of the four control channels 26. YM0OIOB and YM2OIOB are the data lines coupled to the second control channel 26 of the four control channels 26. YM0OIOC and YM2OIOC are the data lines coupled to the third control channel 26 of the four control channels 26. YM0OIOD and YM2OIOD are the data lines coupled to the fourth control channel 26 of the four control channels 26.

As illustrated, the MAT_SEL signal 56 selects the YM0 lines when the MAT_SEL signal 56 is a first value (e.g., 0) and selects the YM2 lines when the MAT_SEL signal 56 is a second value (e.g., 1).

The I/O_SEL0 signal 60 and I/O_SEL1 signal 62 work together to use binary values to select the corresponding channels 22 and 26. For instance, a binary value of "00" selects the first compression channel 22 and corresponding control channel 26, a binary value of "01" selects the second compression channel 22 and corresponding control channel 26, a binary value of "10" selects the third compression channel 22 and corresponding control channel 26, and a binary value of "11" selects the fourth compression channel 22 and corresponding control channel 26. This decoding of binary values may be accomplished using the selection circuitry 64 in each of the channels. In other words, the MAT_SEL signal 56 selects one of two data lines in a channel, and the I/O_SEL0 signal 60 and the I/O_SEL1 signal 62 select the channel.

As illustrated, the output 114 reflects the selected data line of a selected channel. Furthermore, when the odd gap is selected and the even gap is not selected, the output 136 is transmitted to the pass signal 140 used to measure the data.

In the compressed mode, each control channel 26 outputs both data inputs 42 and 44 from corresponding YM0 and YM2 data lines to a corresponding compression channel 22. For instance, Table 1 illustrates a truth table for a first compression channel 22 corresponding to a first set of data lines in an even gap of the sensing amplifier.

TABLE 1

| Truth table for YM0EIOA and YM2EIOA | | | | | | | | |
|---|---|---|---|---|---|---|---|---|
| COMP_SEL | MAT_SEL | I/O_SEL0 | I/O_SEL1 | YM0EIOA | YM2EIOA | DATA0E <0> | DATA1E <0> | MATCHE <0> |
| Even Gap IOA 0 | X | X | X | 0 | 0 | 0 | 0 | 1 |
| 0 | X | X | X | 0 | 1 | 0 | 1 | 0 |
| 0 | X | X | X | 1 | 0 | 1 | 0 | 0 |
| 0 | X | X | X | 1 | 1 | 1 | 1 | 1 |

A DATA0O<2> column 302 and DATA1O<2> column 304 correspond to data inputs 42 and 44 for a third compression channel 22 and a corresponding control channel 26 corresponding to the odd gap of a sensing amplifier of the electronic device 10. A MATCHO<2> column 306 corresponds to the output 45 of the third compression channel 22.

A DATA0O<3> column 308 and DATA1O<3> column 310 correspond to data inputs 42 and 44 for a fourth compression channel 22 and a corresponding control channel 26 corresponding to the odd gap of a sensing amplifier of the electronic device 10. A MATCHO<3> column 312 corresponds to the output 45 of the fourth compression channel 22.

Gap columns 314 and 316 correspond to the sSAGap signal 112 and the nSAGap signal 134. An ErrEven column As illustrated, the control channel 22 receives the COMP_SEL signal 54 as a logic low causing the control channel 26 to output YM0EIOA and YM2EIOA to the corresponding compression channel 22 via corresponding data inputs 42 and 44. Other control channels 26 may each transmit corresponding data line pairs, such as YM0EIOB-YM2EIOB, YM0EIOC-YM2EIOC, YM0EIOD-YM2EIOD, YM0OIOA-YM2OIOA, YM0OIOB-YM2OIOB, YM0OIOC-YM2OIOC, and YM0OIOD-YM2OIOD, to corresponding compression channels 22. The compression channels 22 then transmit the data in the respective data lines to the respective XOR gate to compare the data lines in the output 45 (e.g., MatchE<0>). The compared signals (e.g., outputs 45) from the multiple compression channels 22 are then combined in the selection circuitry to indicate whether there are errors in any of the data lines corresponding to multiple compression channels 22.

Although the foregoing discusses various logic-low and/or logic-high assertion polarities, at least some of these polarities may be inverted in some embodiments. Furthermore, in some embodiments, logic gates as discussed herein may be replaced with similar logical functions, such as p-channel transistors replaced with n-channel transistors with opposite polarity driving signals (e.g., via inverters) and/or other similar changes.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . ." or "step for [perform]ing [a function] . . .", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory device, comprising:
    a plurality of data lines;
    compression circuitry configured to selectively compress inputs; and
    control circuitry configured to receive data over the plurality of data lines, and configured to:
        when in a compressed mode, transmit data from each data line of the plurality of data lines to the compression circuitry; and
        when in an uncompressed mode, transmit data from a first subset of data lines of the plurality of data lines to the compression circuitry while blocking data from a second subset of data lines of the plurality of data lines from being transmitted to the compression circuitry.

2. The memory device of claim 1, wherein the control circuitry comprises a plurality of control channels each configured to receive a pair of data lines of the plurality of data lines.

3. The memory device of claim 2, wherein the compression circuitry comprises a plurality of compression channels, wherein each compression channel of the plurality of compression channels receives a respective pair of data lines from a corresponding control channel.

4. The memory device of claim 3, wherein the control circuitry is configured to receive a selection signal to select corresponding compression and control channels.

5. The memory device of claim 4, wherein the selection signal comprises two selection signals configured to select the corresponding compression and control channels.

6. The memory device of claim 5, wherein each of the two selection signals comprises a bit of a binary selection of the corresponding compression and control channels.

7. The memory device of claim 6, wherein each control channel has selection circuitry configured to activate in response to a specific bit value in the two selection signals.

8. The memory device of claim 3, comprising selection circuitry configured to:
    receive outputs from the plurality of compression channels; and
    output a single output based at least in part on the outputs from the plurality of compression channels.

9. The memory device of claim 8, wherein the single output, in the compressed mode, is indicative of whether errors exist in the plurality of data lines.

10. The memory device of claim 8, wherein the single output, in the uncompressed mode, is indicative of uncompressed data from an individual data line of the plurality of data lines.

11. The memory device of claim 2, wherein the control circuitry is configured to receive a compression selection signal indicating whether the control circuitry operates in the compressed mode or the uncompressed mode.

12. The memory device of claim 2, wherein the control circuitry is configured to receive a data line selection signal configured to select between data lines in a control channel of the control circuitry.

13. A memory device, comprising:
    a plurality of data lines;
    a plurality of compression channels each configured to selectively compress inputs received at the respective compression channel;
    a plurality of control channels each configured to:
        receive data over a subset of data lines the plurality of data lines;
        receive a plurality of control signals; and
        selectively transmit data from one data line of the plurality of data lines or from both data lines of the subset of data lines as the inputs to the respective compression channel; and
    selection circuitry configured to combine outputs from the plurality of compression channels to produce a single output.

14. The memory device of claim 13, wherein the plurality of control signals comprises a compression selection signal, wherein the compression selection signal is configured to cause the plurality of compression channels to pass data from only one of the plurality of data lines when the compression selection signal indicates that compression is not selected.

15. The memory device of claim 14, wherein the plurality of compression channels pass data from only one data line of the plurality of data lines by the plurality of control channels each transmitting data from the respective one data line.

16. The memory device of claim 15, wherein the plurality of control signals comprises a selection signal configured to select the one of the plurality of data lines from the subset of data lines.

17. The memory device of claim 16, wherein the subset of data lines comprises a pair of data lines.

18. The memory device of claim 13, wherein the plurality of control signals comprises a compression selection signal, wherein the compression selection signal is configured to cause the plurality of compression channels each to pass data corresponding to both respective data lines when the compression selection signal indicates that compression is selected.

19. The memory device of claim 13, wherein the plurality of control signals comprises a channel selection signal configured to select the respective control channel from the plurality of control channels.

20. Selective compression circuitry, comprising:
a control channel configured to:
 receive control signals;
 receive a plurality of data signals; and
 select one or more data signals to transmit based at least in part on the control signals; and
a compression channel configured to receive the transmitted one or more data signals, wherein the compression channel is configured to:
 pass the one or more data signals when only a single data signal is passed to the compression channel in the one or more data signals; and
 combine the one or more data signals when more than a single data signal is passed to the compression channel in the one or more data signals.

21. The selective compression circuitry of claim 20, comprising:
a plurality of control channels comprising the control channel; and
a plurality of compression channels comprising the compression channel, wherein the control signals are configured to cause only the control channel to transmit the one or more data signals while causing a remainder of the plurality of control channels to suppress transmission to respective compression channels of the plurality of compression channels of data from respective plurality of data signals received at the respective control channels of the plurality of control channels.

\* \* \* \* \*